(12) United States Patent
Bashir et al.

(10) Patent No.: US 8,463,189 B2
(45) Date of Patent: Jun. 11, 2013

(54) PREDISTORTION CALIBRATION AND BUILT IN SELF TESTING OF A RADIO FREQUENCY POWER AMPLIFIER USING SUBHARMONIC MIXING

(75) Inventors: Imran Bashir, Plano, TX (US); Robert B. Staszewski, Garland, TX (US); Oren E. Eliezer, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1715 days.

(21) Appl. No.: 11/831,948

(22) Filed: Jul. 31, 2007

(65) Prior Publication Data
US 2012/0252382 A1  Oct. 4, 2012

(51) Int. Cl.
*H04W 16/14* (2009.01)
(52) U.S. Cl.
USPC ........................................ 455/63.1
(58) Field of Classification Search
USPC ............. 455/114.1–114.3, 115.1, 115.2, 126, 455/127.1, 501, 63.1, 67.11, 67.13, 67.14, 455/550.1
See application file for complete search history.

(56) References Cited

U.S. PATENT DOCUMENTS

| | | | | |
|---|---|---|---|---|
| 6,047,168 A * | 4/2000 | Carlsson et al. | | 455/126 |
| 6,236,267 B1 * | 5/2001 | Anzil | | 330/149 |
| 6,246,286 B1 * | 6/2001 | Persson | | 330/149 |
| 6,809,598 B1 | 10/2004 | Staszewski et al. | | |
| 7,146,143 B2 * | 12/2006 | Oosawa et al. | | 455/245.1 |
| 7,324,787 B2 * | 1/2008 | Kurakami et al. | | 455/69 |
| 2006/0033582 A1 | 2/2006 | Staszewski et al. | | |
| 2006/0038710 A1 * | 2/2006 | Staszewski et al. | | 341/143 |

* cited by examiner

*Primary Examiner* — Junpeng Chen
(74) *Attorney, Agent, or Firm* — Alan A. R. Cooper; Wade J. Brady, III; Frederick J. Telecky, Jr.

(57) ABSTRACT

A novel and useful apparatus for and method of predistortion calibration and built-in self testing (BIST) of a nonlinear digitally-controlled radio frequency (RF) power amplifier (DPA) using subharmonic mixing. The RF power amplifier output is temporarily coupled into the frequency reference (FREF) input and the phase error samples generated in the phase locked loop (PLL) are then observed and analyzed. The digital predistortion and BIST mechanisms process the phase error samples to calibrate and test the DPA in the transmitter of the Digital RF Processor (DRP). The invention enables the characterization of nonlinearities, the configuration of internal predistortion, as well as the testing of the transmitter's analog RF circuitry, thereby eliminating commonly employed RF performance testing using high-cost test equipment and associated extended test times.

33 Claims, 9 Drawing Sheets

PREDISTORTION CALIBRATION AND BUILT IN SELF TESTING OF A RADIO FREQUENCY POWER AMPLIFIER USING SUBHARMONIC MIXING

FIELD OF THE INVENTION

The present invention relates to the field of data communications and more particularly relates to an apparatus for and method of predistortion calibration and built-in self testing (BIST) of a nonlinear digitally-controlled radio frequency (RF) power amplifier (DPA) using subharmonic mixing.

BACKGROUND OF THE INVENTION

As the market continuously drives price reduction of mobile phones and their components, it becomes increasingly important to reduce all costs associated with the fabrication of a system on chip (SoC) transceivers in cellular handsets. This includes the costs of final testing at production, which is required to constitute only a limited percentage of the total production cost. Additionally, high production yields are required, in order to maintain profitability, thus inhibiting the use of simplified overly-strict tests that would intolerably impact the yield.

Furthermore, customers are increasingly requiring smaller percentages of shipped defective devices, given in units of defective parts per million (DPPM), such that the test coverage and reliability expected from semiconductor manufacturers are demanding as well. Consequently, new testing environments and techniques are sought that would allow these conflicting goals to be met simultaneously.

In recent years, the semiconductor industry has been benefiting from automated means for inserting test circuitry into digital designs and calculating its coverage. The scan-chains used for this purpose provide structural testing, which typically targets the detection of silicon defects through symptoms such as "stuck at 0/1", rather than functionally testing the circuitry. In contrast, in analog/RF designs, the structural approach is not as prevalent and is not built into the most commonly used analog computer aided design (CAD) tools. Radio transceivers have traditionally been designed in "analog friendly" fabrication processes, such as SiGe, with their production testing typically being based on high-cost testers having RF capabilities for both stimuli and measurements.

In addition, the recent trend toward SoC designs force transceiver implementations to adapt to digital design and fabrication environments. This has also created the need and the opportunity for lower cost testing techniques for the transceiver which approach those of the structural nature used for the greater digital portion of the SoC.

As an example, a diagram illustrating close-in spectral performance criteria for the transmitter, defined by the GSM wireless standard is shown in FIG. 1. The spectrum 4 of the output of the example transmitter is shown along with the spectral mask requirement 2. Additional performance criteria for the transmitter include the phase error during transmission, which indicates the modulation accuracy, and the far-out spectral mask. In a system that includes EDGE functionality, where non-constant envelope modulation is used, additional requirements are defined for the modulation accuracy, such as Error-Vector Magnitude (EVM).

Contrary to the GMSK constant envelope modulation of the original GSM system, the 8-PSK non-constant amplitude modulation for EDGE is extremely sensitive to the distortions that the power-amplification stages in the transmitter may introduce. These are known as AM-to-AM and AM-to-PM distortions. The former is a result of the gain curve not being perfectly linear, typically resulting in lower gain experienced for higher input signal levels, as saturation is approached, and the latter is typically caused by an amplitude-dependent phase-shift experienced in the non-linear stage. The transmitter chain elements, in which the modulated signal is created and amplified, must be tested at production and must also be characterized accurately enough for the predistortion mechanisms for them to be effective.

Other prior art techniques for a transceiver BIST involve testing the power amplifier using the receiver chain of the transceiver. This technique, however, is power inefficient as it requires both the transmit and receive chains for testing and calibration. Moreover, the environment of the system during actual application is not the same as during calibration. This is true for half-duplex systems in which the transmitter and receiver are not on at the same time.

These and other prior art measurement and characterization techniques are costly to implement, requiring additional circuitry and/or expensive external test equipment, and require impractically long test times to perform. For example, using conventional external RF test equipment would be cost prohibitive. On the other hand, a conventional very low cost tester (VLCT) is not capable of performing many of the required testing operations.

There is thus a need for a BIST mechanism that is capable of measuring and characterizing the power amplifier and other related internal components of the transmitter. The BIST mechanism should not require any external test equipment nor should it require any significant hardware overhead or operating conditions that depart from those of the normal operation, to the extent that the measurement/characterization may be impacted. Further, the BIST mechanism should reduce the required test time to a minimum and consume minimal power, such that it will not necessitate over-design of the internal power supply circuitry.

SUMMARY OF THE INVENTION

The present invention is a novel and useful apparatus for and method of predistortion calibration and built-in self testing (BIST) of a nonlinear digitally-controlled radio frequency (RF) power amplifier (DPA) using subharmonic mixing. The mechanism is a novel approach in design-for-testing (DfT) applied to a Digital RF Processor (DRP™)-based GSM SoC.

For schemes (such as in 8-PSK that is non-constant amplitude modulation for EDGE) that are extremely sensitive to the distortions (e.g., AM-to-AM and AM-to-PM distortions) the power-amplification stages in the transmitter may introduce, the present invention provides a solution. The solution allows the transmitter to independently test its functionality and the extent of these distortions as part of its production testing in a built-in-self-test (BIST), and may also allow the characterization of these distortions for the purpose of configuring the predistortion mechanisms for them.

The calibration and BIST mechanism of the present invention is operative to (1) create deliberate temporary coupling of the RF power amplifier output into the frequency reference (FREF) input or a crystal oscillator that is used to generate the FREF signal and to (2) observe and measure the resultant phase error samples generated in the phase locked loop (PLL).

Placing the ADPLL slightly away from the integer N channel, e.g., at a 67 kHz distance, which in GSM would be accomplished by transmitting an "all ones" sequence, and coupling this signal from the DPA output into the reference signal slicer results in a 67 kHz mixing product due to the AM-PM conversion in the FREF slicer. This is because the frequency of this integer channel is equal to that of the $N^{th}$ harmonic of the FREF signal and is down converted by it to zero. The down converted signal, equal to the frequency difference 67 kHz in this example, is introduced as additive interference to FREF slicing circuitry, where the sinusoidal crystal-oscillator signal is converted into a square clock-signal of the same frequency. This non-linear slicing operation, results in jitter or phase-modulation that corresponds to the additive interference (i.e. AM-to-PM distortion is experienced).

In one embodiment, effective coupling is achieved using an external amplifier and RF attenuator. The external amplifier increases the sensitivity of the ADPLL system or PHE signal specifically to the weak interfering signal from the DPA output when a small number of DPA transistors are engaged. In this way, the mechanism of the invention extends the dynamic range over which pre-distortion calibration or BIST can be performed.

Consequently, the 67 kHz tone is observable in the phase error signal (PHE), as a phase-domain signal, as it is partially tracked by the ADPLL, being placed slightly beyond the loop bandwidth. It is to be noted that since the ADPLL is fully digital and the phase domain signals are all digital multi-bit signals rather than voltages, the 67 kHz tone may be accurately and fully digitally processed to determine its magnitude and relative phase, from which the information of interest may be extracted, i.e. the RF signal level, and the AM-to-AM and AM-to-PM distortions of the transmitter chain. This is because the magnitude of this 67 kHz tone is dependent upon the output power of the power amplifier, and phase shifts in it correspond to those experienced in the RF signal at the transmitter output. Since the coupling between the RF output and the FREF input is strong and relatively fixed, the output power level can be determined by measuring the level of the tone in the digital phase domain. In the case of a digitally controlled power amplifier, the mechanism scans through the amplitude codes (i.e. transistors) and the resultant phase error (PHE) signal is observed. The presence of defective transistors in the DPA can be detected by analyzing the PHE spectrum.

Calibration of the power amplifier is performed in a similar manner. The mechanism scans though the amplitude codes of the digital power amplifier and the PHE signal is analyzed to determine the amplitude and phase nonlinearities experienced in the DPA. During normal operation, these nonlinearities are compensated for by applying the appropriate predistortion profile that is applied to the input of the power amplifier.

The calibration and BIST mechanism is applicable to numerous wireless communication standards. Examples of several such wireless communication standards include, but are not limited to, Bluetooth EDR, ZigBee, WiBree, GSM/EDGE, WCDMA, etc. In general, the mechanism of the invention is applicable to communication systems that utilize a PLL and a power amplifier, possibly being a transmitter-only system rather than a transceiver system. Moreover, it can be incorporated in numerous types of wireless or wired communication devices such a multimedia player, mobile station, cellular phone, PDA, DSL modem, WPAN device, etc.

To aid in understanding the principles of the present invention, the calibration and BIST mechanism is presented in the context of a GSM/EDGE frequency synthesizer, which provides for RF carrier generation and modulation in the transmitter and for RF down conversion in the receiver. It is not intended, however, that the invention will be limited to the example applications and embodiments presented. It is appreciated that one skilled in the art can apply the principles of the present invention to many other types of communication systems well-known in the art without departing from the spirit and scope of the invention. In addition, the principles of the invention can be applied to other wireless or wired standards and are applicable wherever there is a need to calibrate and test the power amplifier and other related components of the transmitter portion of a communications transceiver.

Advantages of the calibration and BIST mechanism include (1) since the mechanism is implemented internally, no external test equipment is needed; (2) no significant hardware overhead is required since only RF coupling and amplification are required; (3) since the calculation, based on the analysis of the PHE signal, is simple enough to be performed within the on-chip processor, no external processing and time-consuming data transfer are needed; (4) test time is reduced since processing of the phase error (PHE) samples may be done during TX operation, while the test is not obtrusive to the rest of the transceiver and can be run in parallel with other RF BIST tests; (5) the testing mechanism allows many devices to be tested in parallel, since the test is completely internal and only the pass/fail test result needs to be communicated externally to the tester; (6) power consumption is reduced since only the transmitter chain is enabled for testing, thus no strain is placed on the power management system; and (7) since the mechanism does not use the receiver chain, direct or indirect RF coupling for loopback is not required.

Note that some aspects of the invention described herein may be constructed as software objects that are executed in embedded devices as firmware, software objects that are executed as part of a software application on either an embedded or non-embedded computer system such as a digital signal processor (DSP), microcomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention, a method of testing a radio frequency (RF) wireless transmitter, the method comprising the steps of providing a frequency reference input, providing a frequency synthesizer operative to generate an RF signal having a frequency in accordance with the frequency reference input, providing a power amplifier (PA) operative to generate an RF output signal in proportion to an amplitude level, coupling the RF output signal to the frequency reference input, generating a phase error signal as a function of the frequency reference input and the RF signal and scanning through PA amplitude levels and analyzing the resultant phase error signal generated thereby to detect defects in the power amplifier.

There is also provided in accordance with the present invention, a method of predistortion calibration of a radio frequency (RF) power amplifier (PA) in a RF wireless transmitter, the method comprising the steps of providing a frequency reference input, providing a frequency synthesizer operative to generate an RF signal having a frequency in accordance with the frequency reference input, providing the power amplifier (PA) operative to generate a modulated RF output signal in proportion to an amplitude code, coupling the modulated RF output signal to the frequency reference input, generating a phase error signal as a function of the frequency reference input and the output of the frequency synthesizer and applying an amplitude code to the PA and calibrating the PA for any amplitude and phase nonlinearities in accordance with a resultant phase error signal generated thereby.

There is further provided in accordance with the present invention, a radio frequency (RF) wireless transmitter comprising a frequency reference input, a frequency synthesizer operative to generate an RF signal having a frequency in accordance with the frequency reference input, a digital power amplifier (DPA) operative to receive the RF signal and to generate a modulated RF output signal therefrom in proportion to an amplitude code, coupling means for coupling the output of the DPA to the frequency reference input, a phase detector operative to generate a phase error signal as a function of the frequency reference input and the output of the frequency synthesizer and test means for scanning through DPA amplitude codes and analyzing the spectrum of a resultant phase error signal generated thereby to detect defects in the transmitter.

There is also provided in accordance with the present invention, a single chip radio comprising a polar transmitter, the transmitter comprising a frequency reference input, a frequency synthesizer operative to generate an RF signal having a frequency in accordance with the frequency reference input, a digital power amplifier (DPA) operative to receive the RF signal and to generate a modulated RF output signal therefrom in proportion to an amplitude code, coupling means for coupling the output of the DPA to the frequency reference input, a phase detector operative to generate a phase error signal as a function of the frequency reference input and the output of the frequency synthesizer, test means for scanning through DPA amplitude codes and analyzing the spectrum of a resultant phase error signal generated thereby to detect defects in the transmitter, a receiver and a baseband processor.

There is further provided in accordance with the present invention, a mobile communications device comprising a cellular radio comprising a transmitter and receiver, the transmitter comprising a frequency reference input, a frequency synthesizer operative to generate an RF signal having a frequency in accordance with the frequency reference input, a digital power amplifier (DPA) operative to receive the RF signal and to generate a modulated RF output signal therefrom in proportion to an amplitude code, coupling means for coupling the output of the DPA to the frequency reference input, a phase detector operative to generate a phase error signal as a function of the frequency reference input and the output of the frequency synthesizer and a processor coupled to the transmitter and receiver, the processor operative to scan through DPA amplitude codes and analyze the spectrum of a resultant phase error signal generated thereby to detect defects in the radio.

BRIEF DESCRIPTION OF THE DRAWINGS

The invention is herein described, by way of example only, with reference to the accompanying drawings, wherein.

Figure 1:
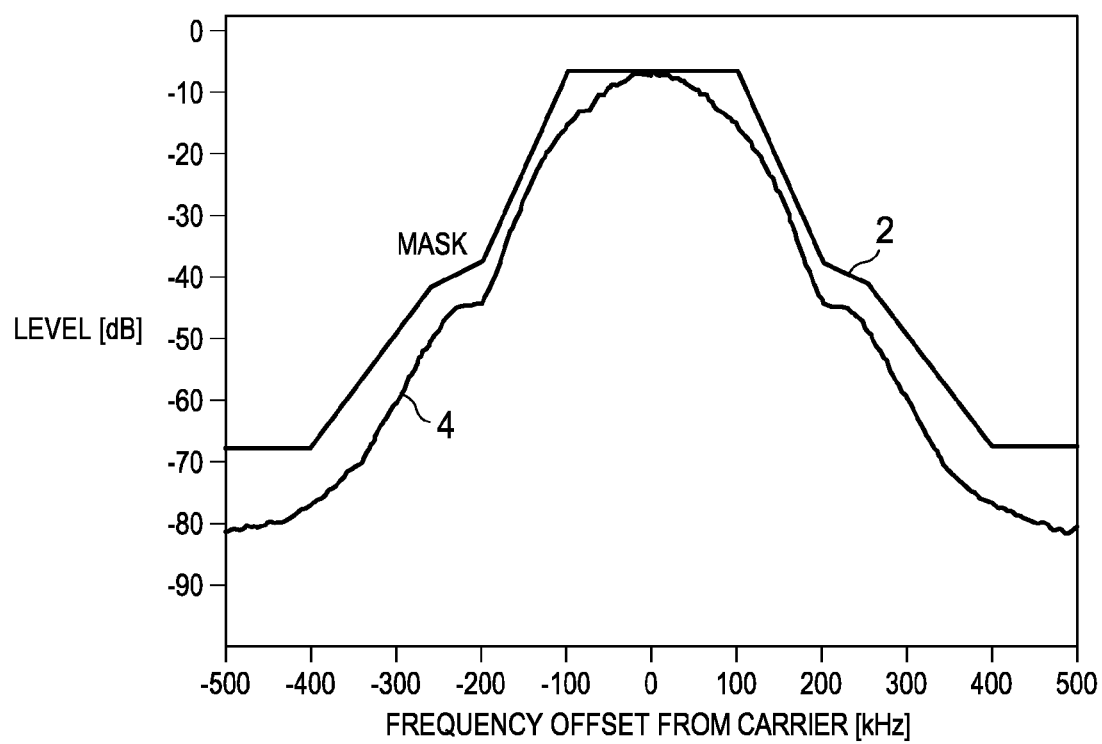
FIG. 1 is a diagram illustrating example performance criteria for a digitally controlled oscillator.

| Term | Definition |
|------|------------|
| AC | Alternating Current |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| AVI | Audio Video Interface |
| BIST | Built-In Self Test |
| BMP | Windows Bitmap |
| CAD | Computer Aided Design |
| CMOS | Complementary Metal Oxide Semiconductor |
| CPU | Central Processing Unit |
| DBB | Digital Baseband |
| DC | Direct Current |
| DCO | Digitally Controlled Oscillator |
| DCXO | Digitally Controlled Crystal Oscillator |
| DEM | Dynamic Element Matching |
| DfC | Design for Characterization |
| DfT | Design for Test |
| DOT | Device Oriented Testing |
| DPPM | Defective Parts Per Million |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EDR | Enhanced Data Rate |
| EPROM | Erasable Programmable Read Only Memory |
| EVM | Error Vector Magnitude |
| FCW | Frequency Command Word |
| FM | Frequency Modulation |
| FPGA | Field Programmable Gate Array |
| GMSK | Gaussian Minimum Shift Keying |
| GPS | Global Positioning System |
| GSM | Global System for Mobile communications |
| HDL | Hardware Description Language |
| HPA | High-Output Power Amplifier |
| IEEE | Institute of Electrical and Electronics Engineers |
| IIR | Infinite Impulse Response |
| JPG | Joint Photographic Experts Group |
| LAN | Local Area Network |
| LDO | Low Drop Out |
| LO | Local Oscillator |
| MBOA | Multiband OFDM Alliance |
| M-DPSK | M-ary Differential Phase-Shift Keying |
| MMS | Massive Multi-Site |
| MOS | Metal Oxide Semiconductor |
| MP3 | MPEG-1 Audio Layer 3 |
| MPG | Moving Picture Experts Group |
| PA | Power Amplifier |
| PC | Personal Computer |
| PDA | Personal Digital Assistant |

-continued

| Term | Definition |
|---|---|
| PHE | Phase Error |
| PLL | Phase Locked Loop |
| PM | Phase Modulation |
| PTE | Phase Trajectory Error |
| RAM | Random Access Memory |
| RF | Radio Frequency |
| RFBIST | RF Built-In Self Test |
| RMS | Root Mean Squared |
| ROM | Read Only Memory |
| SCR | Script Processor |
| SIM | Subscriber Identity Module |
| SNR | Signal to Noise Ratio |
| SoC | System on Chip |
| SRAM | Static Read Only Memory |
| TDC | Time to Digital Converter |
| TDD | Time Division Duplex |
| TV | Television |
| USB | Universal Serial Bus |
| UWB | Ultra Wideband |
| VCO | Voltage Controlled Oscillator |
| VLCT | Very Low Cost Tester |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMV | Windows Media Video |
| WPAN | Wireless Personal Area Network |

DETAILED DESCRIPTION OF THE INVENTION

The present invention is a novel and useful apparatus for and method of predistortion calibration and built-in self testing (BIST) of a radio frequency (RF) power amplifier using subharmonic mixing. The mechanism is a novel approach in design-for-testing (DfT) applied to a Digital RF Processor (DRP™)-based GSM SoC.

The calibration and BIST mechanism of the present invention is operative to (1) create deliberate temporary coupling of the RF power amplifier output into the frequency reference (FREF) input or a crystal oscillator circuit that is used to generate the FREF signal and to (2) observe and measure the resultant phase error samples generated in the phase locked loop (PLL).

Placing the ADPLL slightly away from the integer N channel, e.g., at a 67 kHz distance, which in GSM would be accomplished by transmitting an "all ones" sequence, and coupling this signal from the DPA output into the reference signal slicer results in a 67 kHz mixing product due to the AM-PM conversion in the FREF slicer. This is because the frequency of this integer channel is equal to that of the $N^{th}$ harmonic of the FREF signal and is down converted by it to zero.

The down converted signal, equal to the frequency difference 67 kHz in this example, is introduced as additive interference to FREF slicing circuitry, where the sinusoidal crystal-oscillator signal is converted into a square clock-signal of the same frequency. This non-linear slicing operation, results in jitter or phase-modulation that corresponds to the additive interference (i.e., AM-to-PM is experienced). Consequently, the 67 kHz tone is observable in the phase error signal (PHE), as a phase-domain signal, as it is partially tracked by the ADPLL, being placed slightly beyond the loop bandwidth.

It is to be noted that since the ADPLL is fully digital and the phase domain signals are all digital multi-bit signals rather than voltages, the 67 kHz tone may be accurately and fully digitally processed to determine its magnitude and relative phase, from which the information of interest may be extracted, i.e. the RF signal level, and the AM-to-AM and AM-to-PM distortions of the transmitter chain. This is because the magnitude of this 67 kHz tone is dependent upon the output power of the power amplifier and phase shifts in it correspond to those experienced in the RF signal at the transmitter output. Since the coupling between the RF output and the FREF input is strong and relatively fixed, the output power level can be determined by measuring the level of the tone in the digital phase domain. In the case of a digitally controlled power amplifier, the mechanism scans through the amplitude codes (i.e. transistors) and the resultant phase error (PHE) signal is observed. The presence of defective transistors in the DPA can be detected by analyzing the PHE waveform or spectrum.

Calibration of the power amplifier is performed in a similar manner. The mechanism scans though the amplitude codes of the digital power amplifier and the PHE signal is analyzed to determine the amplitude and phase nonlinearities experienced in the DPA. During normal operation, these nonlinearities are compensated for by applying the appropriate predistortion profile that is applied to the input of the power amplifier.

Although the calibration and BIST mechanism is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transmitter that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations where there is a need to calibrate and test the power amplifier and other related components of the transmitter portion of a communications transceiver.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 2:
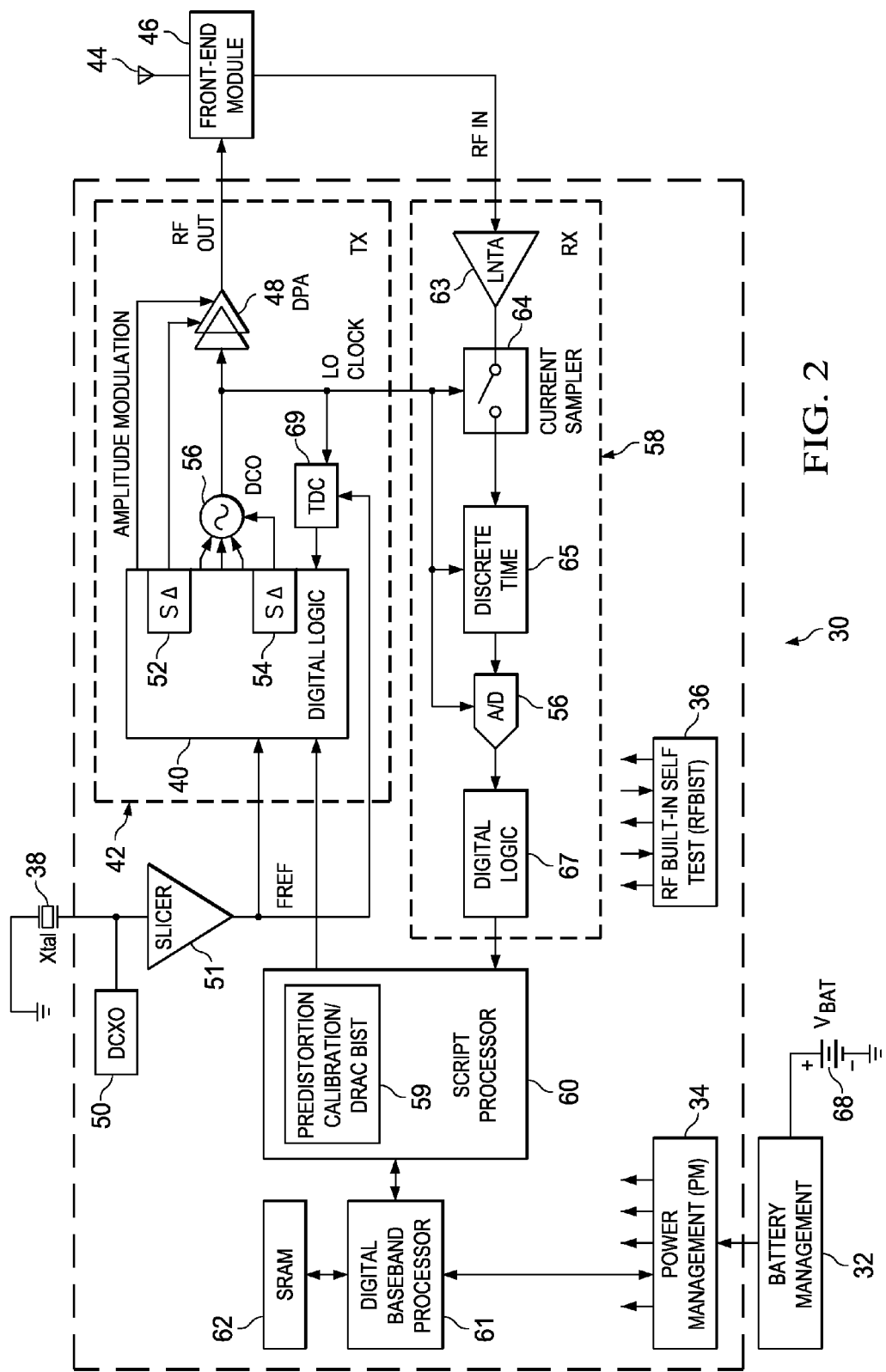
FIG. 2 is a block diagram illustrating a single chip radio incorporating an all-digital local oscillator based polar transmitter and digitally-intensive receiver, as well as DPA calibration and BIST mechanism of the present invention.

A block diagram illustrating a single chip radio incorporating an all-digital local oscillator based polar transmitter and digitally-intensive receiver, as well as DPA calibration and BIST mechanism of the present invention is shown in FIG. 2. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio, generally referenced 30, comprises a script processor 60 adapted to execute the DPA calibration and BIST mechanism of the present invention (represented as task block 59), digital baseband (DBB) processor 61, memory 62 (e.g., static RAM), TX block 42, RX block 58, crystal 38 and digitally controlled crystal oscillator (DCXO) 50, slicer 51, external front-end module 46 and antenna 44, power management unit 34, RF built-in self test (BIST) 36, battery 68 and battery management circuit 32. The TX block comprises high speed and low speed digital logic block 40 including ΣΔ modulators 52, 54, digitally controlled oscillator (DCO) 56 and digitally controlled power amplifier (DPA) 48. The RX block comprises a low noise transconductance amplifier 63, current sampler 64, discrete time processing block 65, analog to digital converter (ADC) 66 and digital logic block 67. Note that alternatively, the DPA calibration and BIST mechanism of the invention can be implemented using dedicated logic. Note that the task 59 of the invention can be implemented as code executed on processor 61 and SRAM 62. Alternatively, dedicated logic could be used.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. This architecture can also be used as the foundation for a UMTS single-chip radio manufactured using a 45 nm CMOS process. The common architecture is highlighted in FIG. 2 with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed ΣΔ dithering of its varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude. It is followed by a matching network and an external front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e. ARM family processor and/or DSP) and SRAM memory 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (or any other desired frequency, such as 38.4 MHz) digitally controlled crystal oscillator (DCXO) 50. An integrated power management (PM) system is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing, various loopback configurations for bit-error rate measurements and implements the DPA calibration and BIST mechanism of the invention, described in more detail infra. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device/Cellular Phone/PDA System

Figure 3:
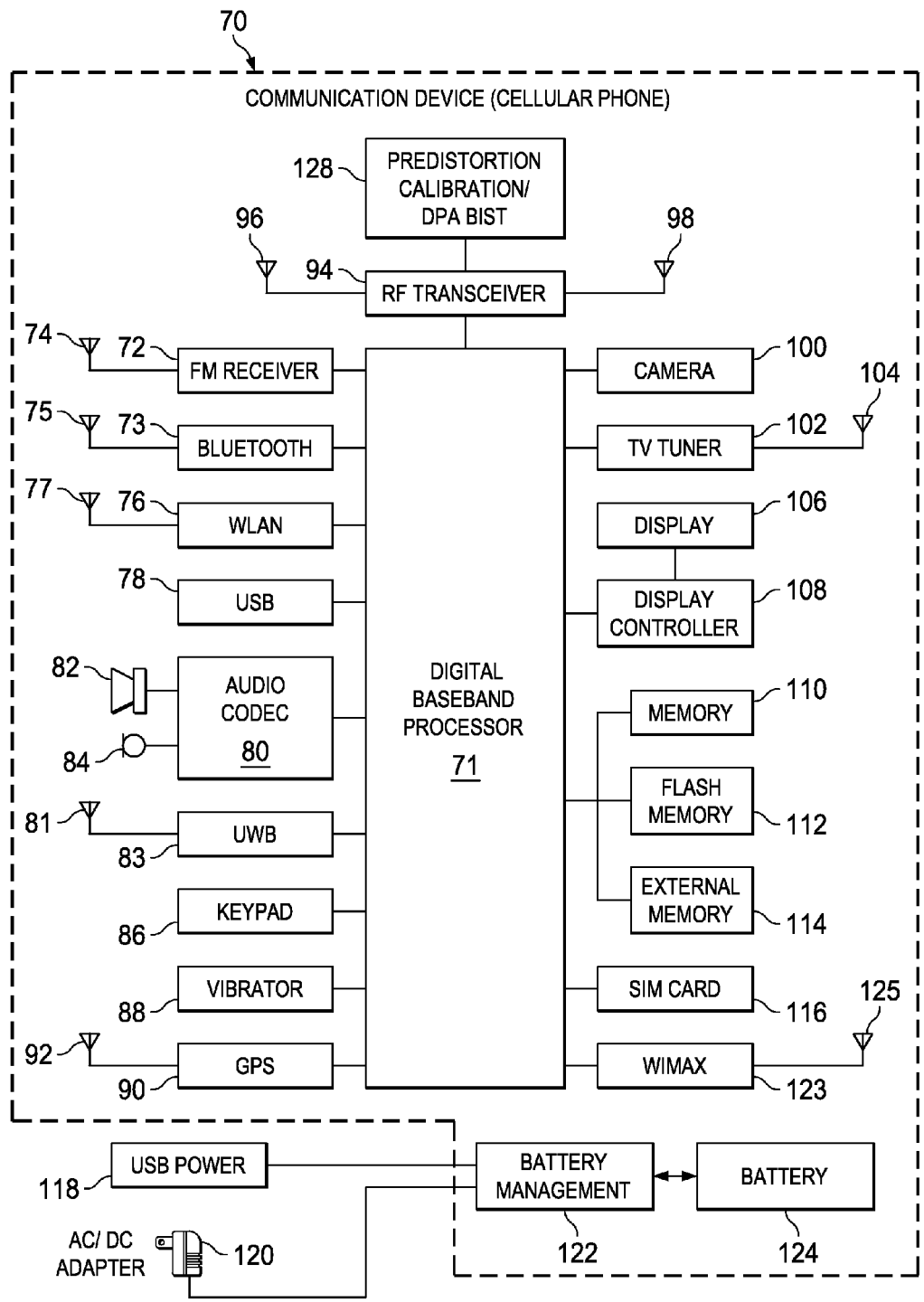
FIG. 3 is a simplified block diagram illustrating an example communication device incorporating the DPA calibration and BIST mechanism of the present invention.

A simplified block diagram illustrating an example communication device incorporating the DPA calibration and BIST mechanism of the present invention is shown in FIG. 3. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the DPA calibration and BIST mechanism of the present invention can be implemented in a wide variety of wireless and wired communication devices.

The cellular phone, generally referenced 70, comprises a baseband processor or CPU 71. The basic cellular link is provided by the RF transceiver 94 and related one or more antennas 96, 98. In accordance with the invention, the DPA calibration and BIST mechanism of the invention is used to test and/or calibrate the transmitter components of the RF transceiver, as described in more detail infra. A plurality of antennas is used to provide antenna diversity which yields improved radio performance. The cell phone also comprises internal RAM and ROM memory 110, Flash memory 112 and external memory 114.

Several user interface devices include microphone 84, speaker 82 and associated audio codec 80, a keypad for entering dialing digits 86, vibrator 88 for alerting a user, camera and related circuitry 100, a TV tuner 102 and associated antenna 104, display 106 and associated display controller 108 and GPS receiver 90 and associated antenna 92.

A USB interface connection 78 provides a serial link to a user's PC or other device. An FM receiver 72 and antenna 74 provide the user the ability to listen to FM broadcasts. WLAN radio and interface 76 and antenna 77 provide wireless connectivity when in a hot spot or within the range of an ad hoc, infrastructure or mesh based wireless LAN network. A Bluetooth EDR radio and interface 73 and antenna 75 provide Bluetooth wireless connectivity when within the range of a Bluetooth wireless network. Further, the communication device 70 may also comprise a WiMAX radio and interface 123 and antenna 125. SIM card 116 provides the interface to a user's SIM card for storing user data such as address book entries, etc.

The communication device 70 also comprises an Ultra Wideband (UWB) radio and interface 83 and antenna 81. The UWB radio typically comprises an MBOA-UWB based radio. A predistortion calibration and DPA BIST block 128 coupled to transceiver 94 is operative to implement the DPA calibration and BIST mechanism of the present invention, described in more detail infra. In operation, the DPA calibration and BIST block 128 may be implemented as hardware, software executed as a task on the baseband processor 71, transceiver's script processor, or a combination of hardware and software. Implemented as a software task, the program code operative to implement the DPA calibration and BIST mechanism of the present invention is stored in one or more memories 110, 112, 114 or within the script processor memory space.

Portable power is provided by the battery 124 coupled to battery management circuitry 122. External power is provided via USB power 118 or an AC/DC adapter 120 connected to the battery management circuitry which is operative to manage the charging and discharging of the battery 124.

Digitally Controlled Power Amplifier

Figure 4:
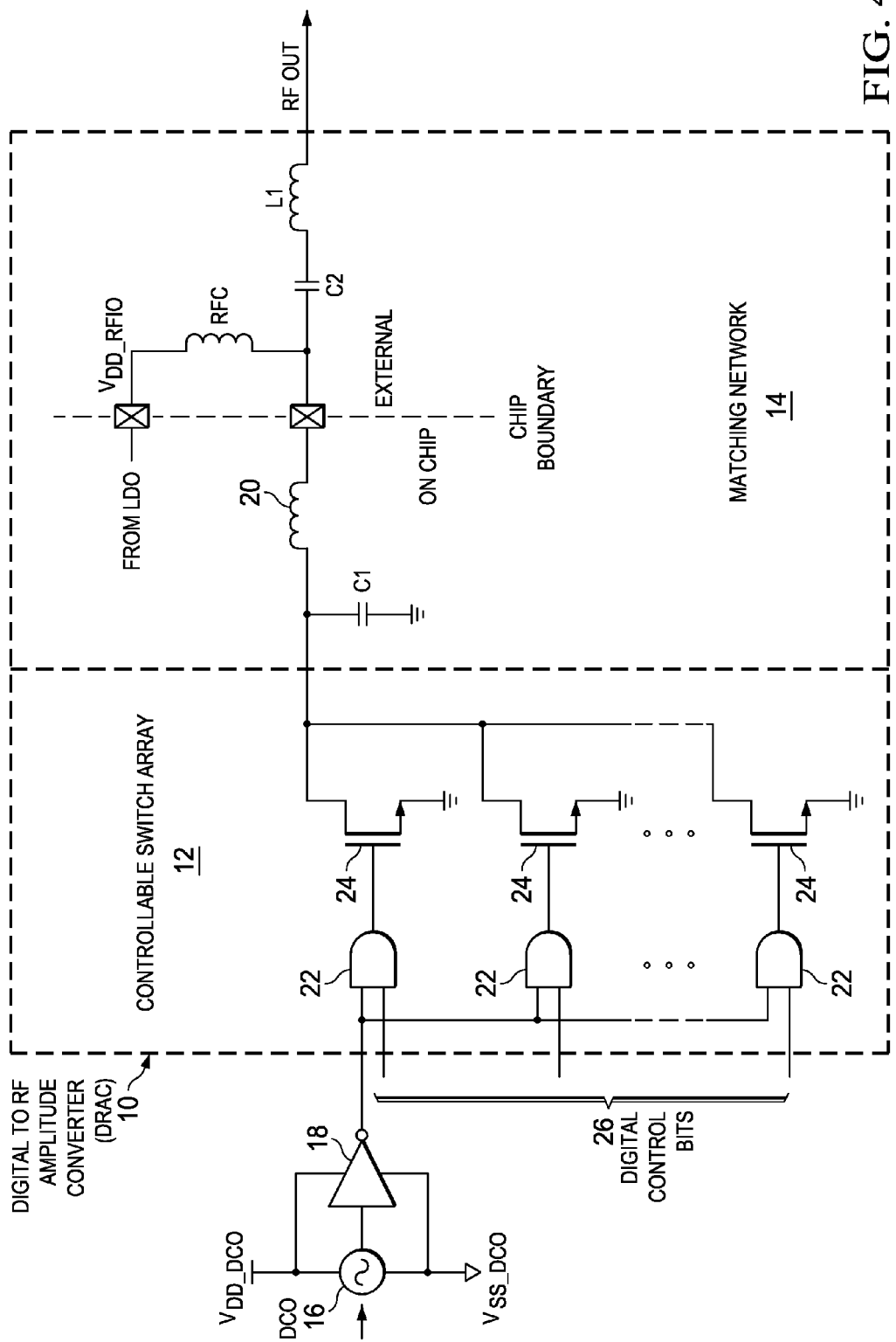
FIG. 4 is a block diagram illustrating the structure of the digitally-controlled power amplifier (DPA) which serves as a digital to RF amplitude converter (DRAC)

The DPA in the polar transmitter, which functions as a digital-to-RF-amplitude converter (DRAC), operates as a near-class E RF power amplifier and is driven by the square wave output of the DCO. A block diagram illustrating the structure of the digitally-controlled power amplifier (DPA) which serves as a digital to RF amplitude converter (DRAC) is shown in FIG. 4. The DRAC, generally referenced 10, comprises a controllable switch array 12 and matching network 14. The controllable switch array comprises a plurality of N pass-gate type AND gates 22 and a plurality of N output devices or switching elements 24 (nMOS devices in this example). The matching network comprises capacitors C1, C2 and inductors 20 (bond wire), L1, RFC together forming a band-pass matching/filtering network.

The DPA (or DRAC) operates as a pseudo class E type amplifier and is driven by a square wave signal output of DCO 16 and buffer 18. Being a class E buffer, no DC bias current is required by the DRAC, unlike class A, class AB, class C or class D amplifiers. The square wave signal is the phase-modulated signal from the all digital PLL (ADPLL) described supra. The N nMOS transistors 24 are used as on/off switches. An RF choke (RFC) functions as a bi-directional RF current source, connecting the nMOS switches to the on-chip supply voltage regulator ($V_{DD\_RFIO}$). The switch array is driven by a digital signal and generates an analog voltage waveform at its output.

Capacitor C1 represents the on-chip capacitance at the drain node of the nMOS transistors of the array and includes, for analysis purposes, the equivalent capacitance over one cycle given by the non-linear $C_{DD}$ of the nMOS switch. The residual second harmonic of the transmit frequency is filtered by the series combination of C2 and L1, allowing the switch array itself to remain a single-ended circuit which produces a non-sinusoidal waveform. The remaining matching network components are selected to achieve the condition where the switch output is critically damped, such that the drain voltage is low when the output current is high and vice versa, thereby allowing high efficiency and low-noise performance.

Furthermore, in order to preserve the gate oxide integrity of the switches 24, the voltage swing at the drain must be controlled by the matching network to satisfy $V_{\textit{eff},GOI} < 2 \cdot V_{DD}$, where $V_{\textit{eff},GOI}$ represents the equivalent DC voltage on the drain resulting from one RF cycle. This buffer circuit is ideally suited to a low voltage environment in a digital CMOS process because, unlike in class A, B and C amplifiers where the transistor acts as a current source, there is no headroom requirement on $V_{DS}$ with this structure. The only requirement is that $V_{GS}$ must be able to go higher than the threshold voltage for the transistor to turn on, which is naturally guaranteed by the input digital signal. Another advantage of this buffer circuit, implemented in a deep submicron CMOS process, is that the extra input circuitry and output filtering circuitry of class F type amplifiers is not required.

The control logic for each nMOS switch comprises a pass-gate type AND gate whose inputs are the phase modulated output of the ADPLL and the amplitude control word (or code word) (ACW) from a digital control block. It is the on-resistance and driving strength of the switch that is exploited in the DRAC concept to introduce power control of the transmitted waveform and allows the fully-digital method of controlling the output power. The AND gate is implemented as a pass-gate rather than a conventional standard fully static AND gate. This has the advantage of minimizing thermal noise from the AND function which in turn reduces the ultimate broadband phase noise floor of the DRAC. This structure also serves to reduce RF carrier leakage, which could result from clock feed-through given the realistic parasitics of the multiple devices. As described supra, alternative implementations of the AND gate function include using a cascode (or current steering topology) or degenerative device together with the driver transistor. These approaches, however, suffer from degraded output noise performance and increased local oscillator (LO) feed through (via device parasitic capacitance) which limits the dynamic range of the DRAC, and are thus not preferred.

In the example implementation, as shown in FIG. 4, the RF output signal generated by the DRAC circuit is optionally input to an external power amplifier 150 (FIG. 5) where the signal is amplified to the appropriate levels in accordance with the particular wireless standard. The output of the power amplifier is then input to an antenna for transmission over the air. The DRAC can also be implemented with a high output-power level, possibly eliminating the need for further amplification at its output. It is appreciated, that the DRAC circuit may be used in non-wireless applications as well, in which case, the signal would not be fed to an antenna (e.g., cable modem applications).

The Digital RF Processor (DRP™)-based RF transmitter shown in FIGS. 2 and 3 incorporates the digitally-controlled power amplifier (DPA) or digital to RF-amplitude converter (DRAC) of FIG. 4. The DPA functions to directly convert a digital amplitude code into amplitude using an array of NMOS transistors. The DPA is used for power ramp as well as amplitude modulation in more advanced modulation schemes, such as the enhanced data rate (EDR) mode of Bluetooth or EDGE. It operates as a near-class-E RF power amplifier and is driven by the square wave output of the DCO. The core NMOS transistors are used as on/off switches and are followed by the matching network that interfaces with an antenna in the case of Bluetooth and with an external power amplifier for GSM/EDGE applications. The number of switches active at a given instance is controlled digitally and establishes the instantaneous amplitude of the output RF envelope.

The DPA, however, induces amplitude and phase distortion over its dynamic range when amplitude modulation is applied. The incorporation of DPA linearization in order to satisfy requirements of complex modulation schemes is necessary in order to ensure compliance with performance measures such as error-vector-magnitude (EVM) and spectral requirements. Hence, the amplitude and phase distortions suffered at the RF output due to the DPA nonlinear characteristics is measured internally and compensated for.

DPA Calibration Mechanism

Figure 5:
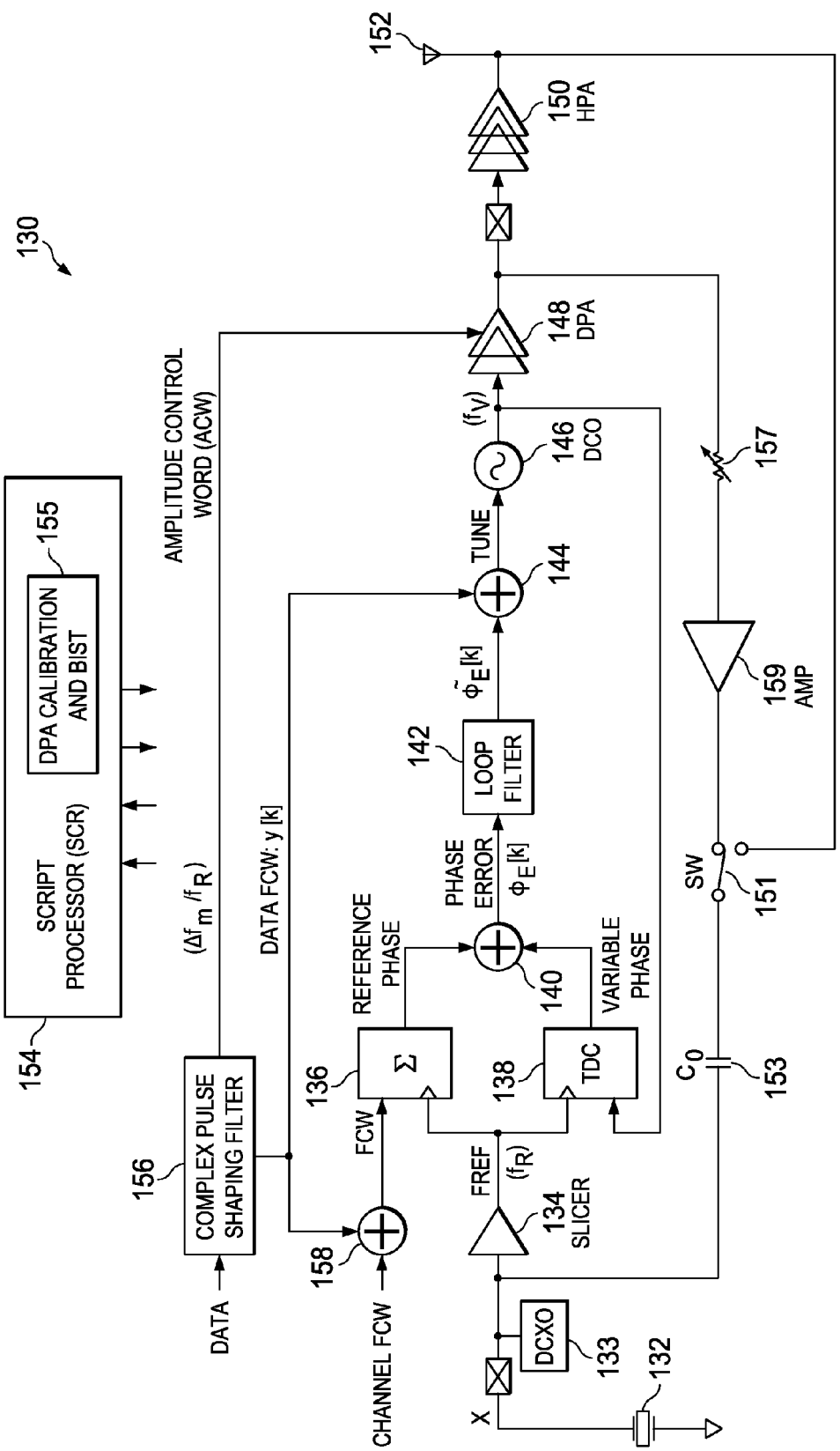
FIG. 5 is a block diagram illustrating an ADPLL-based polar transmitter for wireless applications.

A block diagram illustrating an ADPLL-based polar transmitter for wireless applications is shown in FIG. 5. A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

The transmitter, generally referenced 130, is well-suited for a deep-submicron CMOS implementation. The circuit 130 is operative to perform quadrature modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 146 and a time-to-digital converter (TDC) 138. All inputs and outputs are digital and some even at multi-GHz frequency.

The transmitter comprises complex pulse shaping block 156, script processor (SCR) 154, DPA calibration and BIST block 155, FREF slicer 134 connected to crystal oscillator (DCXO) 133 (which is connected to crystal 132) and digital power amplifier (DPA) 148. The ADPLL comprises an adder 158, reference phase accumulator 136, phase detector 140, loop filter 142, adder 144, DCO 146 and "timestamp" TDC 138. The output of the DPA is transmitted over the antenna 152 after being amplified to the appropriate RF output level by the power amplifier 150. In accordance with the invention, the output of the DPA is coupled via switch 151, capacitor $C_0$ 153, an amplifier 159, and adjustable attenuator 157 to the frequency reference input (i.e. the input to the slicer 134).

Note that in an alternative embodiment, rather than use a dedicated amplifier 159, the actual power amplifier (HPA) 150 used in the system for normal operation can be used instead. Such a setup would serve the purpose of extending the test and/or the predistortion calibration of the present invention to that power amplifier. The coupling from RF signal (RF transmitter output or an internal RF signal) to FREF generation circuit (i.e. crystal, pin, bond wire, oscillator, slicer, etc), however, could be realized using other means, such as magnetic, electromagnetic, resistive and capacitive.

The core of the ADPLL is a digitally controlled oscillator (DCO) adapted to generate the RF oscillator clock CKV. The DCO tuning capacitance is split into a large number of tiny capacitors that are selected digitally. Advanced lithography processes available today permit creation of extremely fine variable capacitors (i.e. varactors) at approximately 40 attofarads of capacitance per step, which equates to the control of only 250 electrons entering or leaving the resonating LC tank (not shown). Despite the small capacitance step, the resulting frequency step at the 2 GHz RF output is 10-20 kHz, which is too coarse for wireless applications. Thus, the fast switching capability of the transistors is utilized by performing programmable high-speed (225-900 MHz) dithering of the finest varactors.

The phase error samples PHE generated by the phase detector 140 are filtered by an IIR filter in the loop filter 142. The modulating data frequency control word (FCW) is injected into two points of the ADPLL to implement direct frequency modulation, i.e. at adders 158 and 144.

The invention provides a mechanism that uses the frequency reference source for the transmitter as an auxiliary receiver for the purpose of predistortion calibration through the reuse of a mechanism targeting the transmitter BIST. By coupling the transmitter RF output signal from the DPA into the frequency reference circuitry at the input of the ADPLL, jitter is induced which is proportional in magnitude to the RF coupled signal, within a certain dynamic range. The induced jitter is evaluated through the processing of the resultant digital phase error signal PHE it creates within the ADPLL. The proposed method relies on the analysis of the characteristics of this signal that is detected by the transmitter BIST mechanism, which in one example embodiment of the invention and is based on software processing of the PHE signal.

Calibration in the application environment (e.g., cellular handset) with respect to output load and supply voltage is important. Any calibration process that deviates from the application environment during calibration might result in undesired errors. From this perspective, the mechanism of the invention has a distinct advantage over the prior art solution requiring transmitter and receiver coupling. A practical example of such case is a radio architecture sharing the transmitter and receiver port, as is typically the case in a Bluetooth transceiver SoC. Engaging the receiver during calibration would present a load to the DPA that is different from the one presented during the transmitter operation. Supply voltage fluctuations also present the same constraint, if it is shared by the transmitter and receiver front ends or if it is affected by the calibration procedure for any other reason.

In addition, the mechanism of the invention puts less strain on the power management system since it only requires the transmitter chain to be active during calibration, as is the case during normal TX operation in time-division-duplex (TDD) transmitters, such as Bluetooth and GSM.

AM-AM Linearization

The ADPLL operates in a digitally-synchronous fixed-point phase domain. As shown in FIG. 5, the DPA output may be electrically coupled (i.e. internally) to the frequency reference (FREF) input circuitry of the ADPLL through a switchable capacitor. This ensures that sufficient energy propagates from the DPA output into the FREF input and that sufficiently high RF amplitudes are experienced. The transmitter is tuned to a harmonic of the reference frequency within the RF band of operation, and a 67 kHz offset is induced by the data frequency command word (FCW) path (by creating an "all ones" data sequence). This frequency-shifted RF signal effectively mixes with the nearby harmonic of the crystal frequency within the reference frequency circuitry resulting in a 67 kHz tone.

This is due to the fact that the slicing operation within the FREF circuitry is only sensitive to the additive RF interference at the zero crossing instances of the FREF sine-wave. This instantaneous sensitivity is equivalent to time sampling, which essentially aliases the input spectrum around all integer multiples of the FREF frequency. The integer multiple closest to the RF frequency acts as a local oscillator signal that down converts the RF signal to zero, resulting in a 67 kHz tone, as in the example above.

The tone is converted into a jitter pattern of proportional magnitude (in units of phase/frequency) through the AM-to-PM effect of the FREF slicer 134 (FIG. 5). The slicer is the circuit used to convert the crystal oscillator analog waveform into a square clock signal. The phase domain signal passes through the loop without suffering significant attenuation, as its frequency is within the order of magnitude of the bandwidth of the closed loop, such that it is observed at PHE at the output of the phase detector 140 (FIG. 5).

An RMS value is calculated from the digital samples of PHE, from which the energy of this signal may be determined, corresponding to the amount of jitter induced onto the input reference frequency of the ADPLL. Since the effect is due to downconversion mechanism described above, the resultant signal in the digital phase domain system reflects the level of the RF signal of interest. Increasing the RF amplitude at the DPA output intensifies the intermodulation, which increases the corresponding jitter on the reference and the resultant amplitude at PHE. This is detected through a corresponding increase in the phase error signal level estimation, based on RMS calculation or spectral analysis, which is performed on the samples of the digital PHE signal. The linear relationship is maintained over a dynamic range of approximately 10 dB, which is sufficient to cover the range of interest in the DPA where AM-AM distortion is suffered and is to be compensated.

In EDGE modulation, for example, the dynamic range for amplitude modulation is about 17 dB, representing a ratio of about 7 between the maximum and minimum instantaneous amplitudes found in the signal's envelope. For the lower instantaneous amplitudes, the DPA does not introduce significant AM-AM distortion, and therefore the 10 dB range, for which the distortion is to be characterized and compensated, would relate to the upper portion of those 17 dB. It is noted, however, that the linear relationship, observed for this range between the magnitude at PHE and the RF amplitude, is not a necessary condition for effective predistortion. Extension of the range, into a nonlinear curve, is feasible, with the associated complexity involving nonlinear computations or a lookup table to be configured based on the characterization of the nonlinear relationship observed beyond the linear range. This additional effort, which resides in the digital/software domain, can be easily implemented in the digitally-intensive DRP environment.

In addition to modulation linearization, such as required for EDGE, the GSM transmitter benefits from linearization of the ramping waveform, which is also prone to distortion as the higher output levels are approached. This application also benefits from the mechanism of the invention, as it allows predistortion not only for the internal DPA but also for the external high-output power amplifier (HPA), which could potentially contribute additional AM-AM distortion. By controllably coupling the RF signal from the HPA output into the reference frequency circuitry, the AM-AM curve of the system may be mapped and corresponding digital linearization can be constructed.

Figure 6:
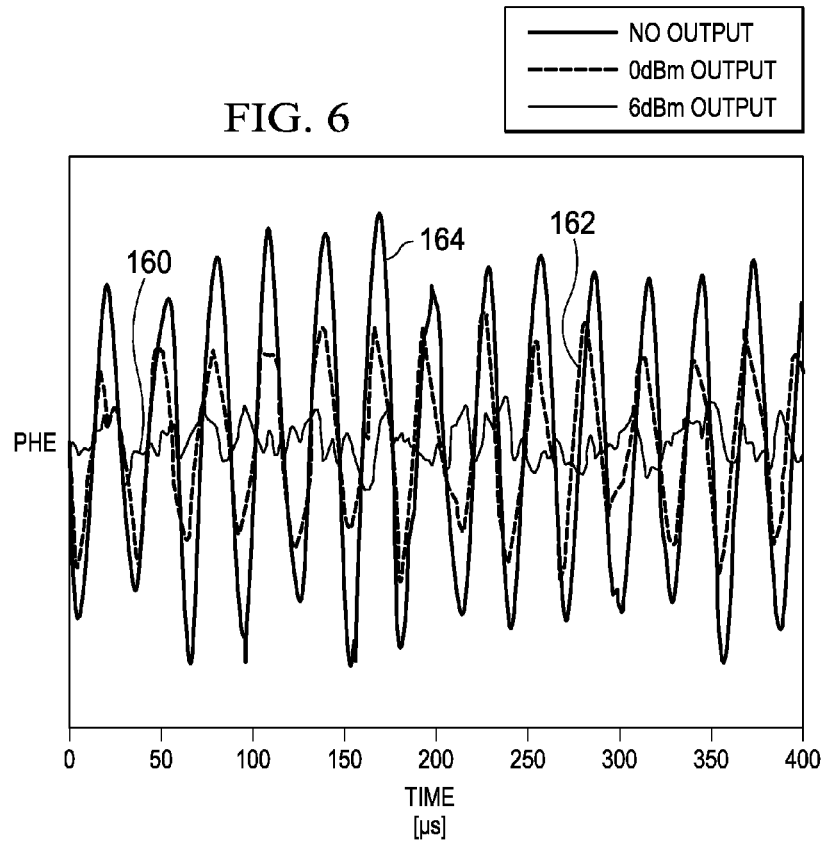
FIG. 6 is a graph illustrating the phase error signal (PHE) over time for several different power levels.

A graph illustrating the measured phase error signal (PHE) over time for several different power levels is shown in FIG. 6. In this figure, the impact of the RF amplitude on the PHE waveform is shown. Curve 160 represents the PHE code for no input; curve 162 represents the PHE code for a 0 dBm input and curve 164 represents the PHE code for a 6 dBm input. The 67 kHz wave at PHE increases as additional DPA transistors are engaged. In this manner, the nonlinear relationship of output power and DPA code is captured which serves as the basis for the configurable AM-AM predistortion mechanism.

The phase trajectory error performance at the RF output can be ascertained with adequate accuracy by observing the internal digital signal $\phi_E[k]$ or PHE output of the phase detector. The PHE signal has a low-pass transfer characteristic to the phase at the ADPLL RF output, which is unity and flat up to the PLL bandwidth cutoff frequency. The close-in phase noise and phase error statistics performed on the PHE correlate closely with test results performed directly at the RF output. Since this signal is essentially the difference between the DCO and the reference phase, no calculation of the ideal phase is required, which is computationally advantageous.

Figure 7:
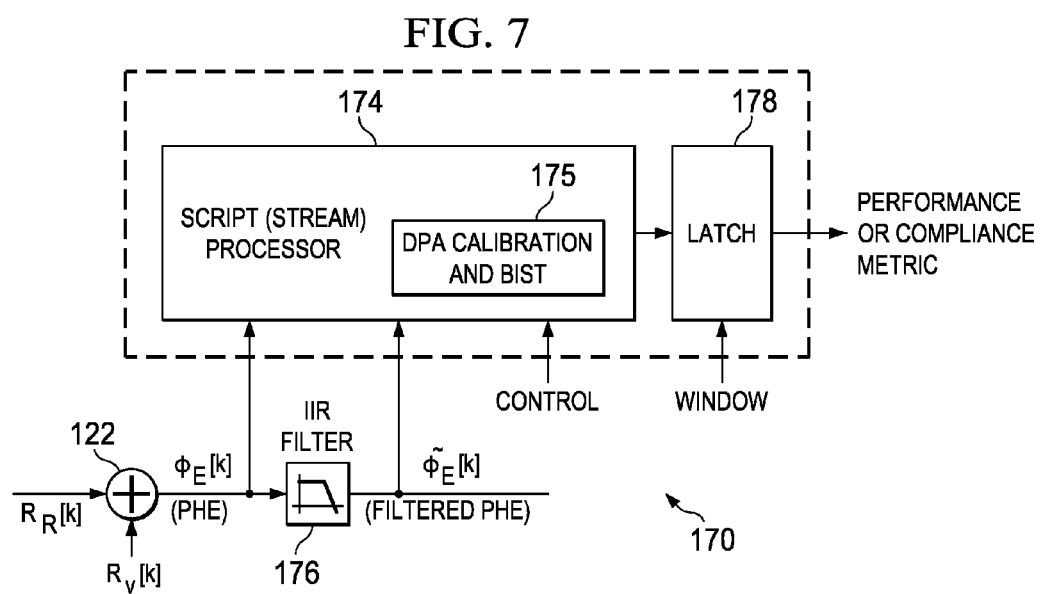
FIG. 7 is a simplified block diagram illustrating the phase error signal analyzer of the present invention.

A simplified block diagram illustrating the phase error signal analyzer of the present invention is shown in FIG. 7. The circuit, generally referenced 170, shows the relevant portions of the transmitter circuit 130 (FIG. 5) including the phase detector 172 and the IIR loop filter 176, and the script processor 174 incorporating a DPA calibration and BIST block 175 and latch 178. The script processor and latch form the PHE signal analyzer that is integrated within the ADPLL. The performance and compliance metric information output of the processor is latched and used to determine whether the device under test passed or failed.

AM-PM Linearization

In the calibration mechanism of the invention, the reference buffer functions to downconvert the RF signal to a baseband signal. Thus, the phase information of the RF output coupled into the reference input is also observable. This can be shown with a simple analysis as follows.

The frequency reference $n^{th}$ harmonic signal at frequency $f_1 = n \cdot f_R$ with phase $\phi_R$ is expressed as follows $$S_R(t) = \cos(2\pi f_1 t + \phi_R) \tag{1}$$

The DCO output signal is set to frequency $f_1$ plus a 67 kHz offset (i.e. GSM symbol frequency) induced by the frequency command word (FCW). The phase of this signal is $\phi_R$ since it is phase locked to the reference phase.

$$S_{DCO}(t) = \cos(2\pi (f_1 + 67 \text{ kHz})t + \phi_R) \tag{2}$$

The signal at the DPA output has some phase distortion added to it while it is undergoing amplitude modulation.

$$S_{DPA}(t) = A(t) \cdot \cos(2\pi (f_1 + 67 \text{ kHz})t + \phi_R + \phi_{DPA}) \tag{3}$$

where A(t) represents the time-varying envelope dictated by the non-constant amplitude modulation. The mixing product of $S_R(t)$ and $S_{DPA}(t)$ at the reference buffer result in two various components. The higher frequency components are naturally suppressed as they are well beyond the bandwidth of the circuits concerned, and the remaining signal at PHE is as follows.

$$S_{PHE}(t) = S_{DPA}(t) \cdot S_R(t) \tag{4}$$

$$S_{PHE} = \alpha \cdot A(t) \cdot \cos(2\pi (67 \text{ kHz})t + \phi_{DPA}) \tag{5}$$

$$S_{PHE} = \alpha \cdot A(t) \cdot \cos(2\pi (67 \text{ kHz})t + \Delta\phi) \tag{6}$$

Figure 8A:
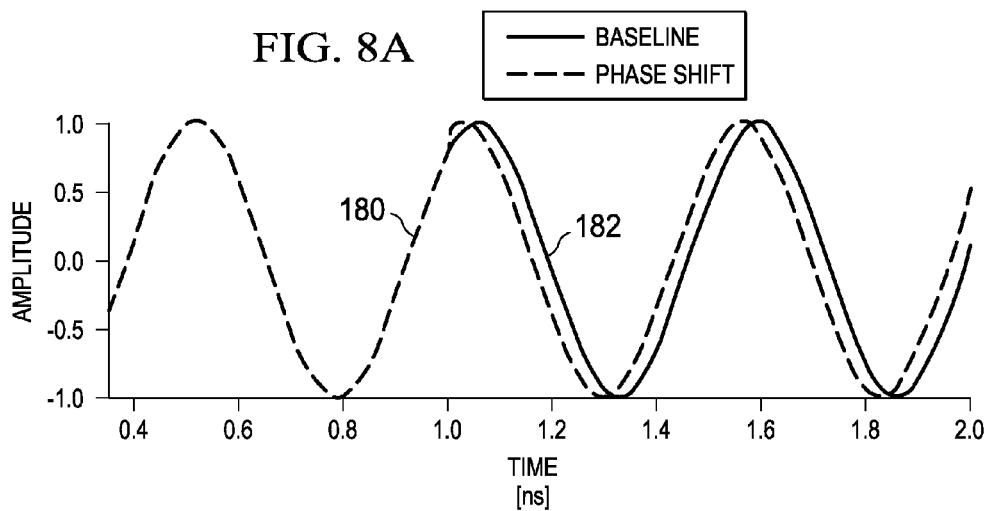
FIG. 8A is a graph illustrating simulated AM-PM distortion at the output of the DPA output.
Figure 8B:
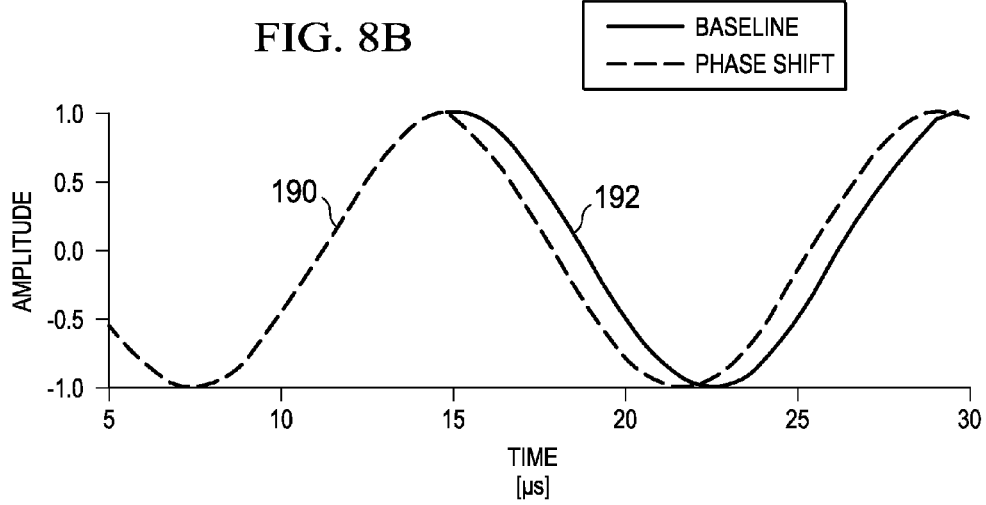
FIG. 8B is a graph illustrating simulated AM-PM distortion in a 67 kHz tone at the phase error output.

The factor $\alpha$ denotes an arbitrary gain factor associated with the intermodulation/down-conversion. The quantity $\Delta\phi$ denotes the measure of AM-PM distortion observable at PHE. The phenomenon described by the equations above is simulated and the results are shown in FIGS. 8A and 8B. FIG. 8A is a graph illustrating simulated AM-PM distortion at the output of the DPA and shows the change in phase as a result of engaging a different number of DPA transistors at the RF output, wherein curve 180 shows the distorted phase while curve 182 shows the baseline phase. FIG. 8B is a graph of simulated $S_{PHE}(t)$ signal which is a mixing product of $S_{DPA}(t)$ and $S_R(t)$ as shown in Equation 4. The simulation demonstrates that the amount of AM-PM distortion suffered by $S_{DPA}(t)$ is tracked by the resulting mixing product i.e. the 67 kHz $S_{PHE}(t)$ tone. In FIG. 8B, curve 190 shows the mixing product undergoing AM-PM phase distortion while curve 192 shows the mixing product that does not suffer any AM-PM distortion.

Measurement Results

Figure 9:
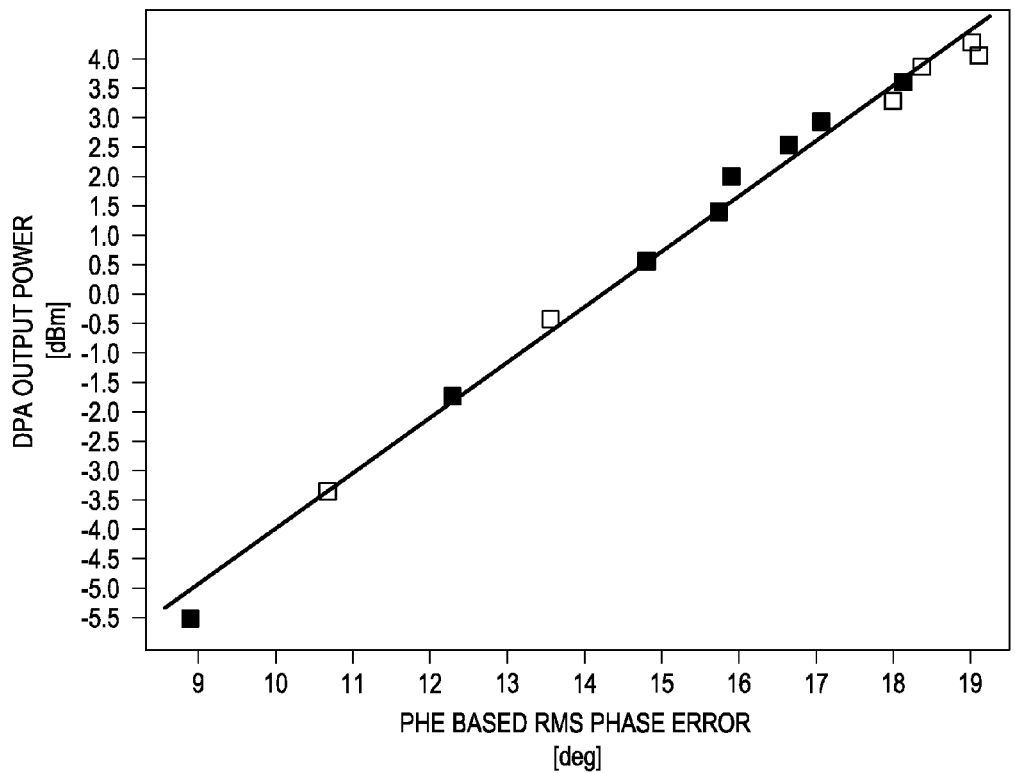
FIG. 9 is a graph illustrating measured DPA output power versus the PHE based estimated RMS phase error in the GSM-900 band.
Figure 10:
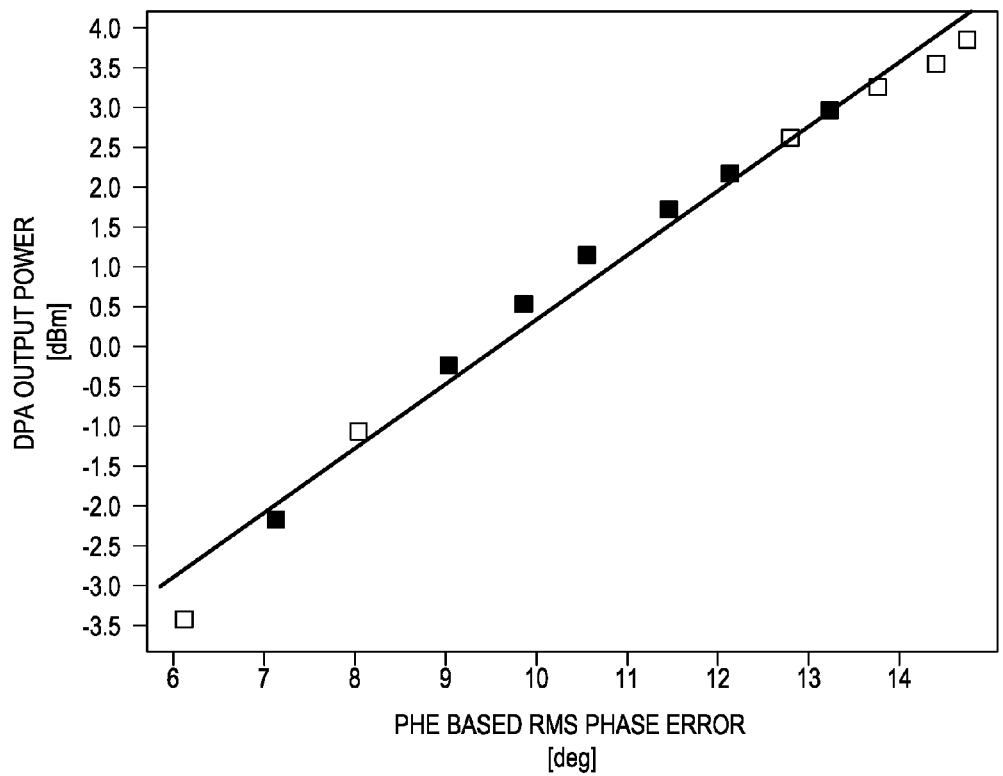
FIG. 10 is a graph illustrating measured DPA output power versus PHE based estimated phase error in the DCS-1800 band.

A graph illustrating measured DPA output power versus the PHE based estimated RMS phase error in the GSM-900 band is shown in FIG. 9. A graph illustrating measured DPA output power versus PHE based estimated phase error in the DCS-1800 band is shown in FIG. 10. FIGS. 9 and 10 show the correlation of DPA output power with estimated RMS phase error from PHE. The measurement is performed by coupling the transmitter output to the reference input as shown in FIG. 5. The transmitter output has a 67 kHz offset from the reference harmonic. The estimated RMS phase error, corresponding to the amplitude of the 67 kHz tone at PHE increases with the number of active DPA transistors and is thus shown to be a reliable measure for the RF output level.

Figure 11:
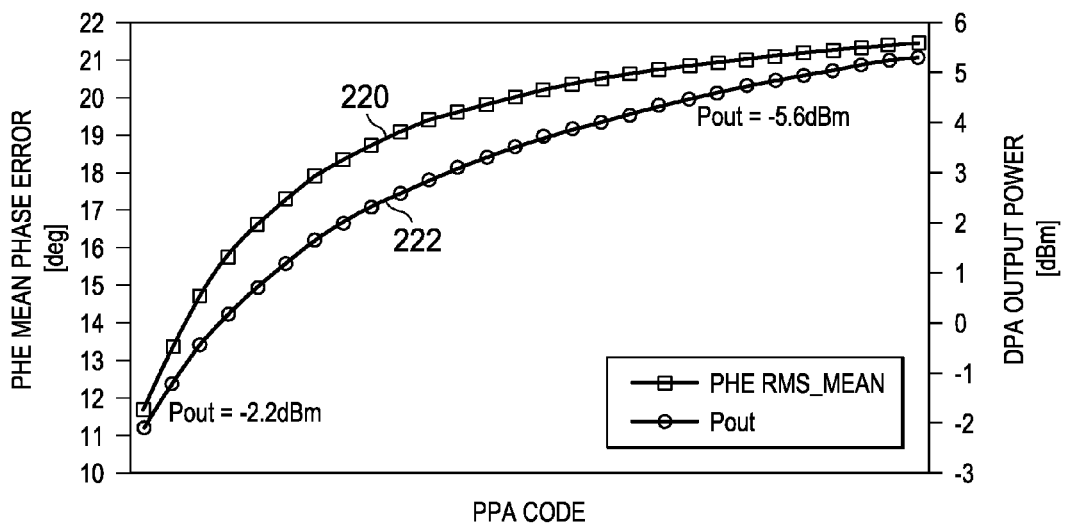
FIG. 11 is a graph illustrating measured AM-AM distortion of the DPA.
Figure 12:
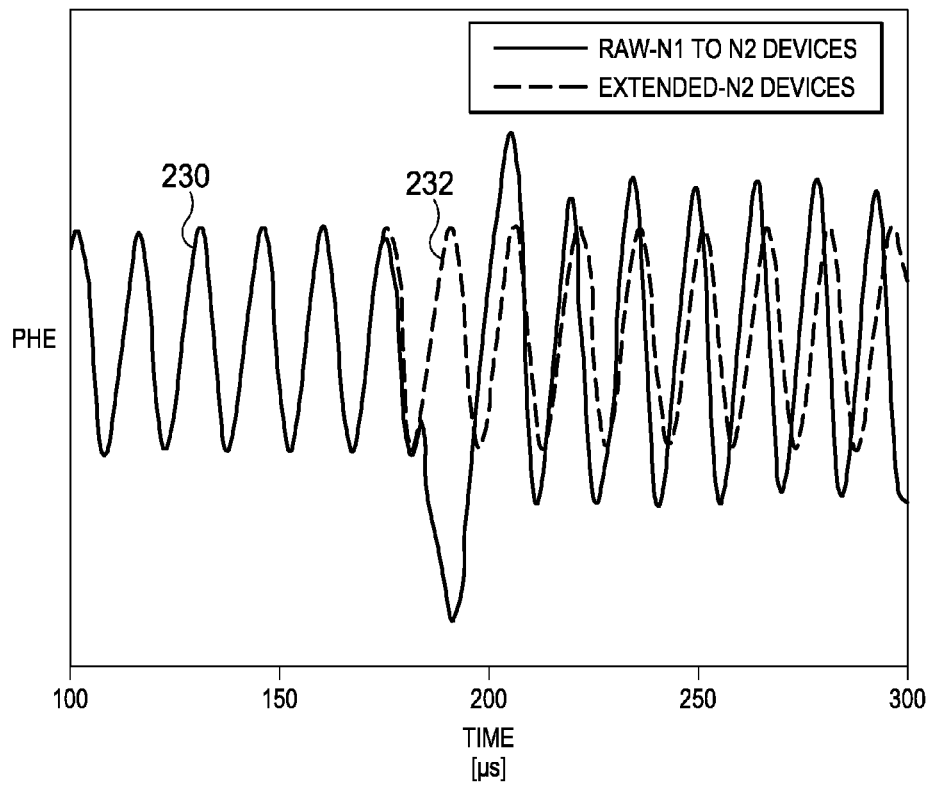
FIG. 12 is a graph illustrating measured AM-PM distortion of the DPA.

A graph illustrating measured AM-AM distortion of the DPA is shown in FIG. 11. This figure shows the relationship of estimated phase error (curve 220) and DPA output power (curve 222) with the number of transistors. A graph illustrating measured AM-PM distortion of the DPA is shown in FIG. 12. This figure shows how the AM-PM predistortion can be calibrated with the 67 kHz tone at PHE, wherein the raw PHE code is shown in curve 230 and the extended PHE shown in curve 232. The 67 kHz tone at PHE undergoes an amplitude transition in the middle of the plot. By extending the waveform before the DPA amplitude transition in time, the amount of phase distortion induced by the DPA is estimated.

Thus, the predistortion calibration mechanism of the invention enables the transmitter to calibrate itself without requiring any external equipment. The environment (i.e. DC supply and RF loading) of the transmitter has been preserved making the calibration more robust and precise. In the example embodiment presented herein, the calibration mechanism performs software based digital signal processing on the digital phase error signal PHE of the ADPLL and therefore requires no dedicated digital hardware for its implementation. The calibration mechanism thus enables the realization of low-cost built-in mechanisms for design-for-characterization (DfC) and design-for-testing (DfT).

DPA BIST Mechanism

The approach of the test mechanism of the invention is structural in nature and does not attempt to directly assess the parametric performance committed in the transceiver's specifications, but rather verifies that its elements do not suffer fabrication defects that would result in incompliance and increased DPPM. As implied earlier, the amount of AM-PM in the reference slicer measured at PHE changes linearly with the output power of the signal from the DPA. Therefore, by scanning through DPA codes and monitoring the variance in the PHE signal, defects suffered by this circuit can be detected.

Thus, the DPA BIST mechanism of the present invention provides a structural testing approach for defect-oriented built-in self-test (BIST) mechanisms for RF. The internal estimations achieved with the BIST mechanisms are in agreement with external measurements and simulated models and effectively serve to substitute for traditional performance tests based on external RF measurements. The test times associated with these BIST routines are relatively low and effectively cover the elements targeted. Note that the BIST mechanism is not only applicable to analog/RF circuitry but is extendable to other blocks of the DRP as well, thus further reducing the need for external tests and reducing test costs for the cellular transceiver SoC.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of testing a radio frequency (RF) wireless transmitter, said method comprising the steps of:
providing a frequency reference input;
providing a frequency synthesizer operative to generate an RF signal having a frequency in accordance with said frequency reference input;
providing a power amplifier (PA) operative to generate an RF output signal in proportion to an amplitude level;
coupling said RF output signal to said frequency reference input;
generating a phase error signal as a function of said frequency reference input and said RF signal; and
scanning through PA amplitude levels and analyzing the phase error signal generated thereby to detect defects in said power amplifier, wherein the phase error signal is a resultant phase error signal,
wherein said frequency reference input is coupled to a slicer operative to generate a frequency reference clock signal.

2. The method according to claim 1, wherein said frequency reference input is coupled to a crystal oscillator.

3. The method according to claim 1, wherein said step of coupling comprises the step of temporarily inserting a coupling element between the output of said PA and said frequency reference input.

4. The method according to claim 1, wherein said step of coupling comprises the step of temporarily inserting a coupling element and an amplifier between the output of said PA and said frequency reference input.

5. The method according to claim 1, wherein said step of coupling generates a down-converted version of said RF output signal as a result of mixing said RF output signal with a reference harmonic whose frequency is close to or equal to that of an RF carrier.

6. The method according to claim 5, wherein said down-converted signal comprises a 67 kHz tone in said phase error signal, wherein the magnitude of said 67 kHz tone is dependent on said PA output power.

7. The method according to claim 6, wherein said PA output power is determined by measuring the level of said 67 kHz tone, said 67 kHz tone appearing as a jitter signal in the phase domain within said transmitter.

8. The method according to claim 5, wherein said down-converted signal represents a zero intermediate frequency (IF) version of said RF output signal modulated with a predetermined data pattern, wherein the spectrum of said zero-IF signal is dependent on the PA output phase with respect to the phase of said frequency reference input.

9. The method according to claim 1, wherein said step of scanning comprises the step of scanning through a plurality of transistors in said PA and analyzing the resultant properties of said phase error signal to detect defects in said transistors.

10. The method according to claim 1, wherein said step of scanning comprises the step of sweeping through a range of signal levels of interest in an external high-power-amplifier (HPA) for the purpose of ascertaining proper operation and functionality of said HPA.

11. The method according to claim 1, wherein said step of sweeping through a range of signal levels of interest in an external high-power-amplifier (HPA) is intended for the purpose of determining the non-linearity of said HPA.

12. The method according to claim 1, wherein said power amplifier comprises a digitally-controlled power amplifier (DPA).

13. The method according to claim 12, wherein said amplitude level comprises a DPA amplitude control word.

14. The method according to claim 1, wherein said defects comprise distortion.

15. A method of predistortion calibration of a radio frequency (RF) power amplifier (PA) in a RF wireless transmitter, said method comprising the steps of:
providing a frequency reference input;
providing a frequency synthesizer operative to generate an RF signal having a frequency in accordance with said frequency reference input;
providing said power amplifier (PA) operative to generate a modulated RF output signal in proportion to an amplitude code;
coupling said modulated RF output signal to said frequency reference input;
generating a phase error signal as a function of said frequency reference input and the output of said frequency synthesizer; and
applying an amplitude code to said PA and calibrating said PA for any amplitude and phase nonlinearities in accordance with the phase error signal generated thereby, wherein the phase error signal is a resultant phase error signal,
wherein said step of coupling generates a down-converted version of said RF output signal as a result of mixing said RF output signal with a reference harmonic whose frequency is close to or equal to that of an RF carrier, wherein said down-converted signal comprises a 67 kHz tone in said phase error signal, wherein the magnitude of said 67 kHz tone is dependent on said PA output power.

16. The method according to claim 15, wherein said step of coupling induces jitter into said phase error signal that is proportional in magnitude to said RF coupled signal.

17. The method according to claim 16, wherein said induced jitter is evaluated by processing of the resultant phase error signal generated thereby.

18. The method according to claim 15, wherein said power amplifier comprises a digitally-controlled power amplifier (DPA).

19. The according to claim 15, wherein said down-converted signal comprises a 67 kHz tone in said phase error signal, wherein the magnitude of said 67 kHz tone is dependent on said PA output power.

20. A radio frequency (RF) wireless transmitter, comprising:
a frequency reference input;
a frequency synthesizer operative to generate an RF signal having a frequency in accordance with said frequency reference input;
a digital power amplifier (DPA) operative to receive said RF signal and to generate a modulated RF output signal therefrom in proportion to an amplitude code;
coupling means for coupling the output of said DPA to said frequency reference input;
a phase detector operative to generate a phase error signal as a function of said frequency reference input and the output of said frequency synthesizer; and
test means for scanning through DPA amplitude codes and analyzing the spectrum of a phase error signal generated thereby to detect defects in said transmitter, wherein the phase error signal is a resultant phase error signal,
wherein said coupling means comprises coupling placed temporarily between the output of said DPA and said frequency reference input.

21. The transmitter according to claim 20, wherein said frequency reference input is coupled to a crystal oscillator.

22. The transmitter according to claim 20, wherein said frequency reference input is coupled to a slicer operative to generate a frequency reference clock signal.

23. The transmitter according to claim 20, wherein said coupling means comprises a coupling circuit and an amplifier placed temporarily between the output of said DPA and said frequency reference input.

24. The transmitter according to claim 20, wherein said coupling means is operative to generate a zero-intermediate frequency (IF) version of an evaluated RF signal as a result of mixing the transmitter output and a reference harmonic.

25. The transmitter according to claim 24, wherein said zero-IF signal comprises a 67 kHz tone observable in said phase error signal, the magnitude of said 67 kHz tone dependent on DPA output power.

26. The transmitter according to claim 25, wherein said DPA output power is determined by measuring the level of said 67 kHz tone in the phase-domain within said transmitter.

27. The transmitter according to claim 20, wherein said test means comprises means for scanning through a plurality of transistors in said DPA and analyzing the resultant spectrum of said phase error signal to detect defects in said transistors.

28. The transmitter according to claim 20, wherein said defects comprise distortion.

29. A single chip radio, comprising:
a polar transmitter, said transmitter comprising:
a frequency reference input;
a frequency synthesizer operative to generate an RF signal having a frequency in accordance with said frequency reference input;
a digital power amplifier (DPA) operative to receive said RF signal and to generate a modulated RF output signal therefrom in proportion to an amplitude code;
coupling means for coupling the output of said DPA to said frequency reference input;
a phase detector operative to generate a phase error signal as a function of said frequency reference input and the output of said frequency synthesizer;
test means for scanning through DPA amplitude codes and analyzing the spectrum of the phase error signal generated thereby to detect defects
in said transmitter, wherein the phase error signal is a resultant phase error signal;
a receiver; and
a baseband processor,
wherein said coupling means comprises a capacitive coupling temporarily placed between the output of said DPA and said frequency reference input.

30. The transmitter according to claim 29, wherein said coupling means is operative to generate a frequency spur as a result of mixing the transmitter output and a reference harmonic, said frequency spur observable in said phase error signal, the magnitude of said spur being dependent on DPA output power.

31. The transmitter according to claim 29, wherein said defects comprise distortion.

32. A mobile communications device, comprising:
a cellular radio comprising a transmitter and receiver;
said transmitter comprising:
a frequency reference input;
a frequency synthesizer operative to generate an RF signal having a frequency in accordance with said frequency reference input;
a digital power amplifier (DPA) operative to receive said RF signal and to generate a modulated RF output signal therefrom in proportion to an amplitude code;
coupling means for coupling the output of said DPA to said frequency reference input;
a phase detector operative to generate a phase error signal as a function of said frequency reference input and the output of said frequency synthesizer; and
a processor coupled to said transmitter and receiver, said processor operative to:
scan through DPA amplitude codes and analyze the spectrum of the phase error
signal generated thereby to detect defects in said radio, wherein the phase error
signal is a resultant phase error signal,
wherein said coupling means comprises a capacitive coupling temporarily placed between the output of said DPA and said frequency reference input.

33. The mobile communications device according to claim 32, wherein said coupling means is operative to generate a frequency spur as a result of mixing the transmitter output and a reference harmonic, said frequency spur observable in said phase error signal, the magnitude of said spur being dependent on DPA output power.

* * * * *